United States Patent
Guo et al.

(10) Patent No.: US 9,951,418 B2
(45) Date of Patent: Apr. 24, 2018

(54) METHOD FOR PREPARING STRUCTURED GRAPHENE ON SIC SUBSTRATE BASED ON CL₂ REACTION

(71) Applicant: Xidian University, Xi'an (CN)

(72) Inventors: Hui Guo, Xi'an (CN); Keji Zhang, Xi'an (CN); Yuming Zhang, Xi'an (CN); Pengfei Deng, Xi'an (CN); Tianmin Lei, Xi'an (CN); Fengqi Zhang, Xi'an (CN)

(73) Assignee: XIDIAN UNIVERSITY, Xi'an, Shaanxi (CN)

( * ) Notice: Subject to any disclaimer, the term of this patent is extended or adjusted under 35 U.S.C. 154(b) by 564 days.

(21) Appl. No.: 14/397,633

(22) PCT Filed: Dec. 31, 2012

(86) PCT No.: PCT/CN2012/087971
§ 371 (c)(1),
(2) Date: Oct. 28, 2014

(87) PCT Pub. No.: WO2013/174139
PCT Pub. Date: Nov. 28, 2013

(65) Prior Publication Data
US 2015/0132506 A1  May 14, 2015

(30) Foreign Application Priority Data
May 23, 2012 (CN) .......................... 2012 1 0162173

(51) Int. Cl.
*C23C 16/26* (2006.01)
*C01B 32/186* (2017.01)
*C01B 32/188* (2017.01)

(52) U.S. Cl.
CPC ............ *C23C 16/26* (2013.01); *C01B 32/186* (2017.08); *C01B 32/188* (2017.08)

(58) Field of Classification Search
CPC ....... C23C 16/26; C23C 16/56; C23C 16/042; C23C 16/0227; C01B 31/0453; C01B 31/0461
(Continued)

(56) References Cited

U.S. PATENT DOCUMENTS 6,784,077 B1 * 8/2004 Lin .................... H01L 21/76224
257/E21.546
8,697,230 B2   4/2014 Ago et al.
(Continued)

FOREIGN PATENT DOCUMENTS

CN         1716522        1/2006
CN       101872120       10/2010
(Continued)

OTHER PUBLICATIONS

Machine translation of CN 102583325 A.*
Machine translation of CN 102924119 A.*

*Primary Examiner* — Michael Wieczorek
*Assistant Examiner* — Michael G Miller
(74) *Attorney, Agent, or Firm* — McDonnell Boehnen Hulbert & Berghoff LLP

(57) ABSTRACT

Disclosed is a method for preparing structured graphene on a SiC substrate on the basis of Cl₂ reaction, the procedures are as follows: firstly, performing standard cleaning to a SiC sample chip; depositing a layer of SiO₂ on the surface of the SiC sample chip and engraving a figure window on the SiO₂ layer; then arranging the windowed sample chip in a quartz tube, introducing a mixed gas of Ar and Cl₂ into the quartz tube, reacting the bare SiC with Cl₂ for 3-8 min at 700-1100° C. to generate a carbon film; arranging the generated carbon film in Ar gas, annealing for 10-30 min at 1000-1200° C. to generate the structured graphene on the window on the carbon film. The method is simple and safe; the generated
(Continued)

structured graphene has a smooth surface and low porosity and can be used for making microelectronic devices.

14 Claims, 2 Drawing Sheets

(58) Field of Classification Search
USPC .......................................... 427/248.1–255.7
See application file for complete search history.

(56) References Cited

U.S. PATENT DOCUMENTS

2009/0200707 A1* 8/2009 Kivioja .................. B82Y 10/00
264/293
2014/0256120 A1 9/2014 Guo et al.

FOREIGN PATENT DOCUMENTS

| CN | 102505113 | | 6/2012 |
| CN | 102505114 A | | 6/2012 |
| CN | 102505140 A | | 6/2012 |
| CN | 102505141 | | 6/2012 |
| CN | 102530936 | | 7/2012 |
| CN | 102583325 A | * | 7/2012 |
| CN | 102583325 A | | 7/2012 |
| CN | 102583330 A | | 7/2012 |
| CN | 102583331 A | | 7/2012 |
| CN | 102674329 | | 9/2012 |
| CN | 102701789 | | 10/2012 |
| CN | 102723258 | | 10/2012 |
| CN | 102924119 A | * | 2/2013 |
| JP | 2011178617 | | 9/2011 |

* cited by examiner

METHOD FOR PREPARING STRUCTURED GRAPHENE ON SIC SUBSTRATE BASED ON CL$_2$ REACTION

CROSS-REFERENCE TO RELATED APPLICATIONS

This application claims priority to International Application No. PCT/CN2012/087971 filed on Dec. 31, 2012, which claims priority to Chinese Application No. CN 201210162173.4 filed on May 23, 2012.

TECHNICAL FIELD

The present invention belongs to microelectronic technology, and relates to a semiconductor film material and the preparation method thereof, particularly the present invention relates to a method for preparing structured graphene on SiC substrate based on Cl$_2$ reaction.

BACKGROUND TECHNOLOGY

Graphene first appeared in laboratory in the year of 2004, at that time the two scientists in the University of Manchester, i.e., Andre Jim and Kostya Novoselov, found that they could obtain a graphite flake that became thinner and thinner by a very simple method. That is, they peeled the graphite flake from the graphite, adhered the two sides of the flake onto a special tape, and after tearing the tape, the graphite flake was divided into two flakes. By continuing the above operation, the flake became thinner and thinner. Finally, they obtained a flake only consisted of one layer of carbon atom, that is, graphene. From then on, the method for preparing graphene was emerged abundantly, and currently there are mainly two preparation methods as follows:

1. Arc-Discharge Method. Rao CNR et al firstly used this method to prepare graphene. They use a mixture gas of hydrogen and helium as the reaction gas. The preparation of graphene by this method is dangerous because it needs a high hydrogen pressure and a large discharge current.

2. SiC thermal decomposing method. In this method, the single crystal SiC is heated so as to remove Si by decomposing the SiC on the surface, and the remaining carbon forms graphene. However, the single crystal SiC used in the SiC thermal decomposition is very expensive and the grown graphene is distributed in a shape of island, the porosity is high and the layer is not uniform. Further, when such obtained graphene is subject to structuralization to make various devices, the electron migration rate is low due to the process of photo-engraving or dry-etching etc, thus affecting the performance of the devices.

Further, the existing preparation method of graphene, such as disclosed in Chinese patent application 200810113596.0 (The Preparation of Graphene by Chemical Vapor Deposition) includes, firstly to prepare the catalyst, and then perform a high temperature chemical vapor deposition, that is, the substrate containing the catalyst is placed into an oxygen-free reactor, the substrate is heated to 500-1200° C., then a carbon-containing source gas is flowed in to carry out the chemical deposition to obtain graphene, after that, the graphene is purified by the acid treatment or the vaporization under low pressure and high temperature to remove the catalyst. The main demerits of this method are: the process is complicated, the catalyst needs to be removed, and the exhausting energy is high so lead to a high cost.

SUMMARY OF THE INVENTION

In view of the above problems in the prior art, an object of the present invention is to provide a method for preparing structured graphene on SiC substrate based on Cl$_2$ reaction so as to improve the smoothness of the surface of graphene, decrease the porosity, avoid the etching process of the graphene in the subsequent procedure to make a device, and ensure the stability of the electron migration rate of the graphene and improve the performance of the device.

For achieving the above objects, the process of the present invention comprises the following steps:

(1) performing standard cleaning to a SiC sample chip to remove the contaminants on its surface;

(2) depositing a layer of SiO$_2$ with a thickness of 0.4-1.2 μm as a mask on the surface of the cleaned SiC sample chip by a Plasma Enhanced Chemical Vapor Deposition (PECVD) method;

(3) coating a layer of photoresist on the surface of the mask; photo-engraving a figure window on the mask in accordance with the shape of an expected device substrate to expose the SiC and form a structured pattern;

(4) placing the windowed sample chip in a quartz tube, heating the windowed sample chip to 700-1100° C. for 3-8 minutes as a mixed gas of Ar and Cl$_2$ is flowed into the quartz tube, and Cl$_2$ is reacted with the bare SiC to generate a carbon film;

(5) arranging the generated carbon film in Ar gas, annealing for 10-30 min under a temperature of 1000-1200° C., wherein the carbon film on the window is reconfigured to graphene so as to obtain a structured graphene. Compared with prior art, the present invention has the following advantages:

1. Since the structured graphene can be selectively grown on the SiC substrate in the prevent invention, a device can be made directly from graphene without etching process, so that the electron migration rate will not decrease so as to ensure the performance of the device.

2. The reaction of SiC with Cl$_2$ in the present invention can be carried out at a relatively low temperature and under normal pressure with a rapid reaction rate.

3. Contributed by the reaction of SiC with Cl$_2$ in the present invention, the obtained graphene has a smooth surface and a low porosity, and the thickness can be easily controlled.

4. The process used in the present invention is simple, safety and saving energy.

DETAILED DESCRIPTION OF THE INVENTION

Figure 1:
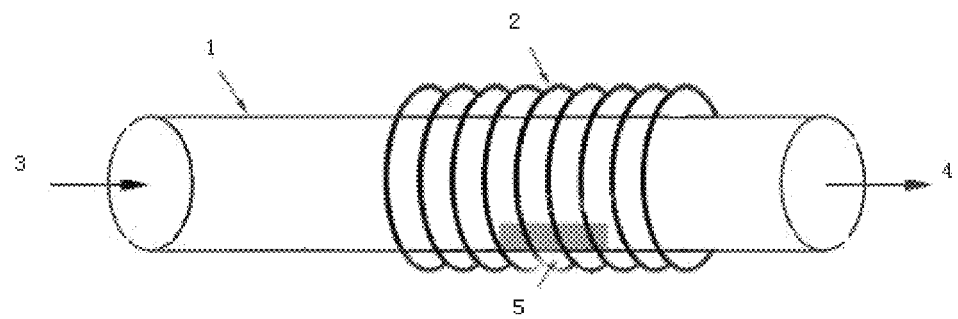
FIG. 1 is a schematic drawing of the device used in the present invention to prepare a structured graphene.

As shown in FIG. 1, the device used in the preparing of structured graphene in the present invention mainly consists of quartz tube 1 and resistance furnace 2, wherein the quartz tube 1 is equipped with inlet 3 and outlet 4, and the resistance furnace 2 has an annular hollow structure with the quartz tube 1 inserted therein. A SiC sample chip 5 used to form a structured graphene is placed into the quartz tube 1.

Figure 2:
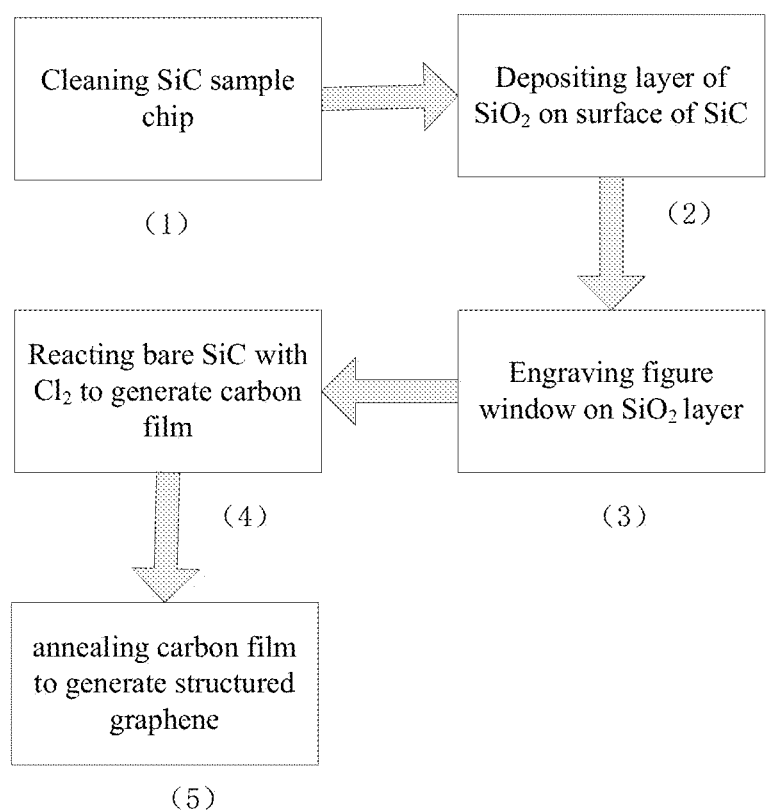
FIG. 2 is a flowing chart showing the preparation of graphene in the present invention.

In the following, the method for preparing a structured graphene in the present invention will be illustrated in detail referring to FIG. 2.

Step (1): firstly, a SiC sample chip is cleaned to remove the contaminants on its surface; The SiC sample chip can be a substrate sheet which has a crystal type of 4H—SiC or 6H—SiC. For removing the surface contaminant on the SiC sample chip, ammonium hydroxide-hydrogen peroxide solution ($NH_4OH+H_2O_2$) and hydrochloric acid-hydrogen peroxide solution ($HCl+H_2O_2$) can be respectively used to clean. In details, the SiC sample chip is soaked for 10-30 min in the reagent of $NH_4OH+H_2O_2$, then taken out and dried to remove the organic residue on the sample surface, and then the sample chip is soaked in the reagent of $HCl+H_2O_2$ for 10-30 min, then taken out and dried to remove the ionic contaminant.

Step (2): then, a layer of $SiO_2$ with a thickness of 0.4-1.4 μm is deposited on the surface of the cleaned SiC sample chip as a mask.

The deposition of $SiO_2$ can be carried by a Plasma Enhanced Chemical Vapor Deposition (PECVD) method or other methods, such as a Low Pressure Chemical Vapor Deposition (LPCVD) method.

In details, the cleaned SiC sample chip is placed in a PECVD system, and then $SiH_4$, $N_2O$ and $N_2$ are flowed into the system to react the $SiH_4$ with $N_2O$, so a layer of $SiO_2$ is deposited on the surface of SiC sample chip as a mask.

The preferred condition is: the flow rate of $SiH_4$, $N_2O$ and $N_2$ is respectively 8-45 sccm, 35-450 sccm and 565-150 sccm, the pressure of the reaction chamber is 2-10 Pa, RF power is 30-220 W, the deposition temperature is 100-300° C. and the deposition time is 20-100 minutes. A specific example in which the flow rate of $SiH_4$, $N_2O$ and $N_2$ is respectively 30 sccm, 60 sccm and 200 sccm, the pressure of the reaction chamber is 3.0 Pa, RF power is 100 W, the deposition temperature is 150° C. and the deposition time is 20-100 minutes can be provided, but it is not restrict to this example.

If the RF power is lower than 30 W, the deposition rate will be low, with the increase of the RF power, the energy provided to the active particles participated in the reaction increases, the probability of the active particles reacted with each other increases, so accelerates the deposition rate. However, when the power is increased to a certain value like 220 W, the uniformity of the film thickness obviously turns worse, and the increasing of the deposition rate slows down obviously, this is because, the amount of active particles participated in the reaction tends to be saturated with the increasing of the power, so that the deposition rate is also tends to be saturated, and stabilized eventually. If the power is over 220 W, the thickness of the film will decrease due to the physical etching on the surface of Si sheet by the plasma, that is, the deposition rate stops increasing while the physical etching still exists and increases with the increasing of the power, leads to the decrease of the thickness of the film. The RF power is preferred to be 60-180 W.

If the pressure of the reaction chamber is lower than 2 Pa, the uniformity of the film thickness will obviously turn worse, this maybe because of, when the pressure is too low, the flow rate of the reacting gas in the reaction chamber is too quick to cause a turbulence in partial areas, so that the reacting gas cannot distribute in the chamber uniformly and the gas concentration in different position varies, so that the deposition rate of film in different position has a big difference. When the pressure of the reaction chamber is in the range of 2-10 Pa, the deposition rate increases with the increasing of the pressure. That is because, with the increasing of pressure, the concentration of reactive gas increases, so the concentration of $SiO_2$ reactants increases respectively, so to improve the deposition rate of the film. When the pressure exceeds 10 Pa, the depositions rate will not change, this is because, more gas molecules participate in the reaction under higher reaction pressure, lead to more frequently collision of ions with each other, under the condition that there is not enough time to get the energy needed for ionization, the too frequent collision will decrease the density of plasma, so restrict the reaction rate.

As for the flow rate of $SiH_4$, $N_2O$ and $N_2$, there is a need to control the flow amount of $N_2O$ meanwhile change the flow amount of $N_2$ to keep the total flow amount of $N_2O$ and $N_2$ to be constant. In order to generate $SiO_2$, the consume ratio of $SiH_4$ to $N_2O$ should be 1:2, but actually the ratio is bigger than this for two reasons. Firstly, it is because that the dissociation of $N_2O$ is low, in the given power condition, not all $N_2O$ molecules can be dissociated to the active particles (mainly O. radicals) participated in the reaction. Secondly, not all of the obtained active particles can combine with Si to generate a $SiO_2$, other O combines with H to generate OH even $H_2O$. When the flow rate of $N_2O$ is lower than 35 sccm, the deposition rate is low, when the flow rate of $N_2O$ is higher than 35 sccm, because the $SiH_4$ is exhausted completely, so the deposition rate will not increase with the increasing of the $N_2O$ and the uniformity of the film will declined slightly. Under such consideration, it is preferred that the flow rate of $N_2O$ is controlled in the range of 35-450 sccm, and the flow rate of $SiH_4$ and $N_2$ is respectively controlled in the range of 8-45 sccm and 565-150 sccm.

The deposition temperature is preferred in the range of 100-300° C. because the process stability and the film uniformity are good in this range.

The thickness of the obtained $SiO_2$ mask is preferred in the range of 0.4-1.2 μm and can be controlled by the deposition time. If the layer of mask is too thin, it will be consumed easily during the etching process and can not mask well; if it is too thick, the effect of etching is not good.

Step (3): a figure window is photo-engraved on the $SiO_2$ mask layer

A figure window can be engraved on the $SiO_2$ mask layer by a regular photo-dry/wet etching process. First, a layer of photoresist is coated on the $SiO_2$ mask; then, a photolithograph is produced in accordance with the shape of an expected device substrate, then the figure in the photolithograph is transferred onto the $SiO_2$ mask layer by photo-etching; finally, the $SiO_2$ mask layer is etched by a buffer solution of HF to expose the SiC and provide a figure window so as to form a structured pattern.

Step (4): the windowed sample chip is placed in a quartz tube, the air is drained out of the quartz tube and the windowed sample chip is heated to 700-1100° C. as a mixed gas of Ar and $Cl_2$ is flowed into the quartz tube, and $Cl_2$ is reacted with the bare SiC to generate a carbon film.

The windowed sample chip 5 is placed in the quartz tube 1 as shown in FIG. 1, and then the quartz tube is put into the resistance furnace 2, then, a mixture gas of Ar and $Cl_2$ is introduced into the quartz tube via inlet 3 to drain the air out of the quartz tube from outlet 4 for 10 min, then, turn on the power of resistance furnace 2 to heat the quartz tube to 700-1100° C.

At this time, the $Cl_2$ in the mixture gas reacts with the bare SiC to grow carbon film according to the following scheme:

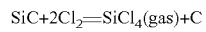

$$SiC+2Cl_2=SiCl_4(gas)+C$$

The resulting $SiCl_4$ is discharged from the reaction system in a form of gas. In the present invention, SiC can react with $Cl_2$ at a relatively low temperature and under normal pressure according to the above schemes, and the reaction rate is rapid, thus the energy can be greatly saved.

When the heating temperature is lower than 700° C., the reaction rate is very slow, and the skin layer of SiC has not been completely converted to carbon, in other words, the thickness of the resulting carbon film is too thin. When the heating temperature is in the range of 700-1100° C., the reaction rate is fast and the thickness of the carbon film is increased with the increasing of temperature. If the temperature is above 1100° C., a belt shape graphite is created, and the pore size is increased. At this time, the reaction rate is mainly dominated by kinetic factors. So the heating temperature is set as 700-1100° C., preferably 800-1000° C.

In the above step, the flow rate of Ar gas and $Cl_2$ gas is preferable set as 95-98 sccm and 5-2 sccm respectively. By defining the flow rate of $Cl_2$ gas in this range, the chlorination rate can be better controlled not be too fast, and a too fast rate would result in too much carbon, which is not favorable for the formation of graphene film. Ar gas is act as a dilution gas and the total flow amount of Ar gas and $Cl_2$ gas is about 100 sccm.

Further, when the duration time of reaction is too short, such as less than 3 min, only a small amount of carbon film is grown. The longer the time, the thicker the resulting carbon film is. The reaction time can be controlled according to the desired thickness of the obtained carbon film. The reaction time is preferably 3-15 min, more preferably 3-8 min.

Step (5): the obtained carbon film is reconfigured to a structured graphene

The temperature of the resistant finance is raised to 1000° C. or higher. Ar gas is introduced into the quartz tube to perform annealing for the obtained carbon film, and carbon film on the window is reconfigured to graphene so as to obtain a structured graphene. Said structured graphene has a figure as same as the figure of the expected device substrate to be made.

During the annealing, an annealing temperature of 1000-1200° C. is appropriate, if the temperature is too low, there is no enough energy provided for the reconfiguration of the carbon film, while if the temperature is too high, the reconfiguration is not uniform, accompanied with many resulting defects. The annealing time is preferably 10-30 min, if the annealing time is too short, the porosity of the graphene is high, and the quality thereof is not good, with a longer annealing time, the porosity of the graphene is decreased, and the surface thereof is much smooth. However, if the time is too much longer, new defects would be resulted, and the quality of the graphene would decrease.

In addition, there is no restriction to the flow rate of Ar gas at the time of annealing, which is mainly determined based on the size of the annealing chamber and the size of the substrate, and is preferably 25-100 ml/min. The sample undergoes a heat treatment under the protection of Ar gas, thus the absorbed chlorine gas in the sample can be desorbed.

The structured graphene obtained by the preparation method of present invention has a smooth surface and a low porosity, so it is suitable for making a microelectronic device.

Compared with prior art, the present invention has the following advantages:

1. Since the structured graphene can be selectively grown on the SiC substrate in the prevent invention, a device can be made directly from graphene without etching process in the subsequent procedures for making the device, so that the electron migration rate in the graphene will not decrease so as to ensure the performance of the device.

2. The reaction of SiC with $Cl_2$ in the present invention can be carried out at a relatively low temperature and under normal pressure with a rapid reaction rate.

3. Contributed by the reaction of SiC with $Cl_2$ gas in the present invention, the obtained graphene has a smooth surface and a low porosity, and the thickness can be easily controlled.

4. The process in the present invention is simple, safety and saving energy.

Below, three examples are provided for the preparation process of the structured graphene in the present invention. It needs to be noted that the examples are only illustrations for the present preparation process, and the specific conditions disclosed therein do not make any restriction to the scope of the present invention.

EXAMPLE 1

Step (1): a 6H—SiC sample chip was cleaned to remove the contaminants on its surface;

(1.1) a 6H—SiC sample chip was soaked in the reagent of $NH_4OH+H_2O_2$ for 10 min, then taken out and dried to remove the organic residue on the sample surface, (1.2) after been removed the surface contaminates, the 6H—SiC sample chip was soaked in the reagent of $HCl+H_2O_2$ for 10 min, then taken out and dried to remove the ionic contaminant.

Step (2): a mask layer of $SiO_2$ was deposited on the surface of the 6H—SiC sample chip.

(2.1) the cleaned 6H—SiC sample chip was placed in a PECVD system, the pressure of the system was adjust to 3.0 Pa, the RF power was adjust to 100 W, and the temperature was adjust to 150° C.

(2.2) then $SiH_4$, $N_2O$ and $N_2$ were flowed into the system for 20 min in a flow rate of 30 sccm, 60 sccm and 200 sccm respectively, and $SiH_4$ reacted with $N_2O$ to deposit a mask layer of $SiO_2$ with a thickness of 0.4 μm on the surface of 6H—SiC sample chip.

Step (3): a figure window was engraved on the $SiO_2$ mask layer (3.1) a layer of photoresist was coated on the $SiO_2$ mask;

(3.2) a photolithograph was produced in accordance with the shape of an expected device substrate, then the figure of the photolithograph was transferred onto the $SiO_2$ mask layer by photo-etching;

(3.3) the $SiO_2$ mask layer was etched by a buffer solution of HF to expose the 6H—SiC and provide a figure window so as to form a structured pattern.

Step (4): the windowed sample chip was placed in a quartz tube, the air was drained outside and the sample was heated as a mixed gas of Ar and $Cl_2$ was flowed into the quartz tube, and $Cl_2$ reacted with the bare SiC to generate a carbon film.

(4.1) the windowed sample chip was placed in the quartz tube 1, and then the quartz tube was put into the resistance furnace 2, (4.2) Ar gas was introduced into the quartz tube via inlet 3 in a flow rate of 80 sccm to drain the air out of the quartz tube from outlet 4 for 10 min.

(4.3) turned on the power of resistance furnace to heat the quartz tube to 700° C.

(4.4) a mixture gas of Ar and $Cl_2$ was introduced into the quartz tube for 5 min in a flow rate of 98 sccm and 2 sccm respectively, $Cl_2$ reacted with the bare 6H—SiC to generate a carbon film.

Step (5): the carbon film was reconfigured to a structured graphene

The temperature of the resistant finance was raised to 1000° C. Ar gas was introduced into the quartz tube in a flow rate of 100 sccm, the resulting carbon film was annealed for 10 min, and reconfigured to a structured graphene on the window.

EXAMPLE 2

Step one: a 4H—SiC sample chip was cleaned to remove the contaminants on its surface.

a 4H—SiC sample chip was soaked in the reagent of $NH_4OH+H_2O_2$ for 10 min, then taken out and dried to remove the organic residue on the sample surface; after that, it was soaked in the reagent of $HCl+H_2O_2$ for 10 min, then taken out and dried to remove the ionic contaminant.

Step two: a layer of $SiO_2$ was deposited on the surface of the 4H—SiC sample chip.

the cleaned 4H—SiC sample chip was placed in a PECVD system, the pressure of the system was adjust to 3.0 Pa, the RF power was adjust to 100 W, and the temperature was adjust to 150° C.; then $SiH_4$, $N_2O$ and $N_2$ were flowed into the system for 75 min in a flow rate of 30 sccm, 60 sccm and 200 sccm respectively, and $SiH_4$ reacted with $N_2O$ to deposit a mask layer of $SiO_2$ with a thickness of 0.8 μm on the surface of 4H—SiC sample chip.

Step three: a figure window was engraved on the $SiO_2$ mask layer.

a layer of photoresist was coated on the $SiO_2$ mask; a photolithograph was produced in accordance with the shape of an expected device substrate, then the figure of the photolithograph was transferred onto the $SiO_2$ mask layer by photo-etching; the $SiO_2$ mask layer was etched by a buffer solution of HF to expose the 4H—SiC and provide a figure window so as to form a structured pattern.

Step four: the windowed sample chip was placed in a quartz tube, the air was drained outside and the sample was heated as a mixed gas of Ar and $Cl_2$ was flowed into the quartz tube, and $Cl_2$ reacted with the bare SiC to generate a carbon film.

the windowed sample chip was placed in the quartz tube 1, and then the quartz tube was put into the resistance furnace 2; Ar gas was introduced into the quartz tube via inlet 3 in a flow rate of 80 sccm to drain he air out of the quartz tube from outlet 4 for 10 min, then, turned on the power of resistance furnace to heat the quartz tube to 1000° C.

A mixture gas of Ar and $Cl_2$ was introduced into the quartz tube for 3 min in a flow rate of 97 sccm and 3 sccm respectively, $Cl_2$ reacted with the bare 4H—SiC to generate a carbon film.

Step five: the carbon film was reconfigured to a grapheme

The temperature of the resistant finance was raised to 1050° C. Ar gas was introduced into the quartz tube in a flow rate of 75 sccm, the resulting carbon film was annealed for 15 min and reconfigured to a structured graphene on the window.

EXAMPLE 3

Step A: the surface of a 6H—SiC sample chip was subjected to a cleaning treatment, that is, firstly the sample chip was soaked in the reagent of $NH_4OH+H_2O_2$ for 10 min, then taken out and dried to remove the organic residue on the sample surface; after that, it was soaked in the reagent of $HCl+H_2O_2$ for 10 min, then taken out and dried to remove the ionic contaminant.

Step B: the cleaned 6H—SiC sample chip was placed in a PECVD system, the pressure of the system was adjust to 3.0 Pa, the RF power was adjust to 100 W, and the temperature was adjust to 150° C.; then $SiH_4$, $N_2O$ and $N_2$ were flowed into the system for 100 min in a flow rate of 30 sccm, 60 sccm and 200 sccm respectively, and $SiH_4$ reacted with $N_2O$ to deposit a mask layer of $SiO_2$ with a thickness of 1.2 μm on the surface of 6H—SiC sample chip.

Step C: a layer of photoresist was coated on the $SiO_2$ mask; a photolithograph was produced in accordance with the shape of an expected device substrate, then the figure of the photolithograph was transferred onto the $SiO_2$ mask layer by photo-etching; the $SiO_2$ mask layer was etched by a buffer solution of HF to expose the 6H—SiC and provide a figure window so as to form a structured pattern.

Step D: the windowed sample chip was placed in the quartz tube 1, and then the quartz tube was put into the resistance furnace 2; Ar gas was introduced into the quartz tube via inlet 3 in a flow rate of 80 sccm to drain he air out of the quartz tube from outlet 4 for 10 min, then turned on the power of resistance furnace to heat the quartz tube to 1100° C.; a mixture gas of Ar and $Cl_2$ was introduced into the quartz tube for 8 min in a flow rate of 95 sccm and 5 sccm respectively, $Cl_2$ reacted with the bare 6H—SiC to generate a carbon film.

Step E: The temperature of the resistant finance was raised to 1200° C. Ar gas was introduced into the quartz tube in a flow rate of 25 sccm, the resulting carbon film was annealed for 30 min and reconfigured to a structured graphene on the window.

What is claimed is:

1. A method for preparing structured graphene on SiC substrate based on $Cl_2$ reaction, characterized in that said process comprises the following steps:
    (1) performing cleaning to a SiC sample chip to remove contaminants on its surface;
    (2) depositing a layer of $SiO_2$ with a thickness of 0.4-1.2 μm as a mask on the surface of the cleaned SiC sample chip by a Plasma Enhanced Chemical Vapor Deposition (PECVD) method;
    (3) coating a layer of photoresist on the surface of the mask; photo-engraving a figure window on the mask in accordance with the shape of an expected device substrate to expose the SiC and form a structured pattern;
    (4) placing the windowed sample chip in a quartz tube, heating the windowed sample chip to 700-1100° C. for 3-8 minutes as a mixed gas of Ar and $Cl_2$ is flowed into the quartz tube, and $Cl_2$ is reacted with the bare SiC to generate a carbon film;
    (5) arranging the generated carbon film in Ar gas, annealing for 10-30 min under a temperature of 1000-1200° C., wherein the carbon film on the window is reconfigured to graphene so as to obtain a structured graphene.

2. The method for preparing structured graphene on SiC substrate based on $Cl_2$ reaction according to claim 1, characterized in that said step (1) performing cleaning to a SiC sample chip is, firstly the SiC sample chip is soaked for 10-30 minutes by using reagent $NH_4OH+H_2O_2$, then taken out and dried to remove the organic residue on the sample surface, and then the sample is soaked in reagent $HCl+H_2O_2$ for 10-30 minutes, then taken out and dried to remove ionic contaminant.

3. The method for preparing structured graphene on SiC substrate based on $Cl_2$ reaction according to claim 1, characterized in that in said step (2), the condition of depositing $SiO_2$ by PECVD method is, the flow rate of $SiH_4$, $N_2O$ and $N_2$ is respectively 30 sccm, 60 sccm and 200 sccm, the pressure of a reaction chamber is 3.0 Pa, RF power is 100 W, the deposition temperature is 150° C. and the deposition time is 20-100 minutes.

4. The method for preparing structured graphene on SiC substrate based on $Cl_2$ reaction according to claim 1, characterized in that in said step (2), the condition of depositing $SiO_2$ by PECVD method is, the flow rate of $SiH_4$, $N_2O$ and $N_2$ is respectively 8-45 sccm, 35-450 sccm and 150-565 sccm, the pressure of a reaction chamber is 2-10 Pa, RF power is 30-220 W, the deposition temperature is 100-300° C. and the deposition time is 20-100 minutes.

5. The method for preparing structured graphene on SiC substrate based on $Cl_2$ reaction according to claim 4, characterized in that in step (4), the flow rate of the flowed Ar and $Cl_2$ is respectively 95-98 sccm and 2-5 sccm.

6. The method for preparing structured graphene on SiC substrate based on $Cl_2$ reaction according to claim 5, characterized in that in step (5), the flow rate of Ar when annealing is 25-100 sccm.

7. The method for preparing structured graphene on SiC substrate based on $Cl_2$ reaction according to claim 6, characterized in that the SiC sample chip has a crystal type of 4H—SiC or 6H—SiC.

8. The method for preparing structured graphene on SiC substrate based on $Cl_2$ reaction according to claim 5, characterized in that the SiC sample chip has a crystal type of 4H—SiC or 6H—SiC.

9. The method for preparing structured graphene on SiC substrate based on $Cl_2$ reaction according to claim 4, characterized in that in step (5), the flow rate of Ar when annealing is 25-100 sccm.

10. The method for preparing structured graphene on SiC substrate based on $Cl_2$ reaction according to claim 4, characterized in that the SiC sample chip has a crystal type of 4H—SiC or 6H—SiC.

11. The method for preparing structured graphene on SiC substrate based on $Cl_2$ reaction according to claim 1, characterized in that in step (4), the flow rate of the flowed Ar and $Cl_2$ is respectively 95-98 sccm and 2-5 sccm.

12. The method for preparing structured graphene on SiC substrate based on $Cl_2$ reaction according to claim 11, characterized in that in step (5), the flow rate of Ar when annealing is 25-100 sccm.

13. The method for preparing structured graphene on SiC substrate based on $Cl_2$ reaction according to claim 1, characterized in that in step (5), the flow rate of Ar when annealing is 25-100 sccm.

14. The method for preparing structured graphene on SiC substrate based on $Cl_2$ reaction according to claim 1, characterized in that the SiC sample chip has a crystal type of 4H—SiC or 6H—SiC.

* * * * *